United States Patent [19]

Kim

[11] Patent Number: 5,440,276

[45] Date of Patent: Aug. 8, 1995

[54] VOLTAGE CONTROLLED OSCILLATING CIRCUIT FOR PREVENTING A LOAD PULLING

[75] Inventor: Jung H. Kim, Seoul, Rep. of Korea

[73] Assignee: Samsung Electro-Mechanics Co., Ltd., Suwon, Rep. of Korea

[21] Appl. No.: 157,707

[22] Filed: Nov. 24, 1993

[30] Foreign Application Priority Data

Nov. 26, 1992 [KR] Rep. of Korea .................. 92-22447

[51] Int. Cl.$^6$ ............................................. H03B 5/00
[52] U.S. Cl. ..................... 331/117 FE; 331/99; 331/117 D; 331/117 R
[58] Field of Search .......... 331/96, 99, 117 D, 117 R, 331/117 FE, 177 V, 167, 75, 185

[56] References Cited

FOREIGN PATENT DOCUMENTS 0029209 2/1987 Japan ................. 331/117 D
0179904 8/1991 Japan ................. 331/117 R Primary Examiner—Robert J. Pascal
Assistant Examiner—David Vu
Attorney, Agent, or Firm—Webb Ziesenheim Bruening Logsdon Orkin & Hanson

[57] ABSTRACT

A voltage controlled oscillating circuit is disclosed. The circuit includes: a μ-strip resonance circuit for deciding the resonance frequency in accordance with an external tuning voltage; an oscillation amplifying circuit for performing oscillations in accordance with the resonance frequency signals of the μ-strip resonance circuit; and a buffer amplifying circuit provided between the oscillating circuit and the load, and for preventing the load pulling phenomenon. The oscillation amplifying circuit forms a common collector oscillating circuit in with a single oscillation amplifying transistor, and the buffer amplifying circuit forms a single step amplifying circuit with a single buffer amplifying transistor. The oscillation amplifying transistor and the buffer amplifying transistor form a cascode amplifying transistor with a signal inducing coil and an RF choke coil for blocking the ac components and for forming a series of dc bias paths. Consequently, a low power consumption and a miniaturization of the voltage controlled oscillating circuit are realized, as well as a low product price.

1 Claim, 2 Drawing Sheets

VOLTAGE CONTROLLED OSCILLATING CIRCUIT FOR PREVENTING A LOAD PULLING

FIELD OF THE INVENTION

The present invention is related to a voltage controlled oscillator (VCO) for use on a mobile communication device, and particularly to a voltage controlled oscillating circuit in which amplifying transistors for an oscillating circuit and a single stage buffer amplifying circuit are provided in the form of a cascode amplifying circuit, thereby improving the load pulling characteristics of the VCO.

BACKGROUND OF THE INVENTION

Generally, a voltage controlled oscillating circuit in which a micro strip ($\mu$-strip) resonator is adopted is low in its Q-factor of the output, and therefore, much influence is received from the load. Therefore, in the conventional voltage controlled oscillating circuit, there is provided a multi-stage buffer amplifying circuit.

FIG. 1 illustrates a conventional circuit of the VCO, and as shown in this drawing, the VCO includes a $\mu$-strip resonance circuit 60, an oscillation amplifying circuit 10, a two-stage buffer amplifying circuit 20, and an oscillation output impedance matching circuit 30.

The $\mu$-strip resonance circuit 60 includes: a varactor diode VD1 with its capacitance varied in accordance with an external tuning voltage $V_T$, a capacitor C23 connected to the varactor diode VD1 in series, and a micro strip line S1, thereby determining the resonance frequency. The resonance frequency signals which are selected by the $\mu$-strip resonance circuit 60 produce oscillations through capacitors C1 and C4 and an oscillating transistor Q1 of the oscillation amplifying circuit 10. The oscillation output is supplied through a coupling capacitor C12 to the two-stage buffer amplifying circuit 20.

The oscillating transistor Q1 is connected at its base to bias resistors R2 and R4, and is also connected at its emitter bias resistor R6. A B+ circuit voltage which is supplied to the bias resistors R2, R4 and R6 and to the collector of the oscillating transistor Q1 is supplied through an AC blocking RF choke coil L1 and a capacitor C2 for bypassing the noise of the power source. A capacitor C3 provides a ground-bypassing path and forms a common collector for the oscillation amplifying circuit 10.

The two-stage buffer amplifying circuit 20 includes two transistors Q2 and Q3 which are connected to by-passing capacitors C5-C7 and to bias resistors R1, R3, R5 and R7. The B+ circuit voltage is supplied through an RF choke coil L3.

The output of the two-stage buffer amplifying circuit 20 is supplied through the output impedance matching circuit 30 to the load, and the output impedance matching circuit 30 includes a coil L5 and capacitors C8 and C9.

However, the conventional VCO circuit as described above includes a two-stage buffering circuit such that the output of the VCO does not receive the load pulling influence from the load, and therefore, the constitution of the circuit becomes complicated, with the result that the bulk of the circuit is magnified, and the manufacturing cost is increased.

SUMMARY OF THE INVENTION

The present invention provides a new VCO circuit in which a cascode-coupling between the oscillating circuit and the buffer amplifying circuit is realized to simplify the buffer amplifying circuit, whereby the circuit size and the driving power for the VCO are reduced.

The VCO circuit according to the present invention includes an oscillating transistor provided in an oscillating circuit connected to a $\mu$-strip resonance circuit, and an amplifying transistor provided in a buffer amplifying circuit, whereby a cascode amplifying circuit is formed.

BRIEF DESCRIPTION OF THE DRAWINGS

The above feature and other advantages of the present invention will become more apparent by describing in detail the preferred embodiment of the present invention with reference to the attached drawings in which.

DESCRIPTION OF THE PREFERRED EMBODIMENT

Figure 1:
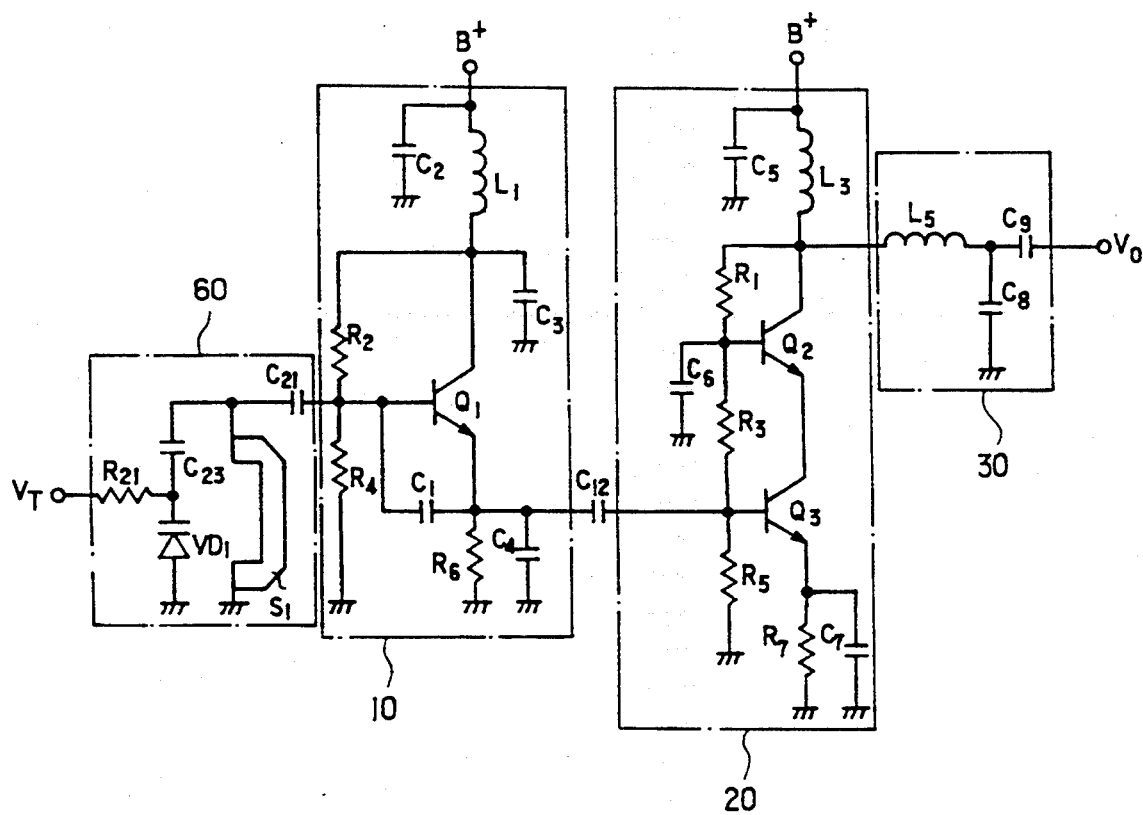
FIG. 1 illustrates a conventional VCO circuit.
Figure 2:
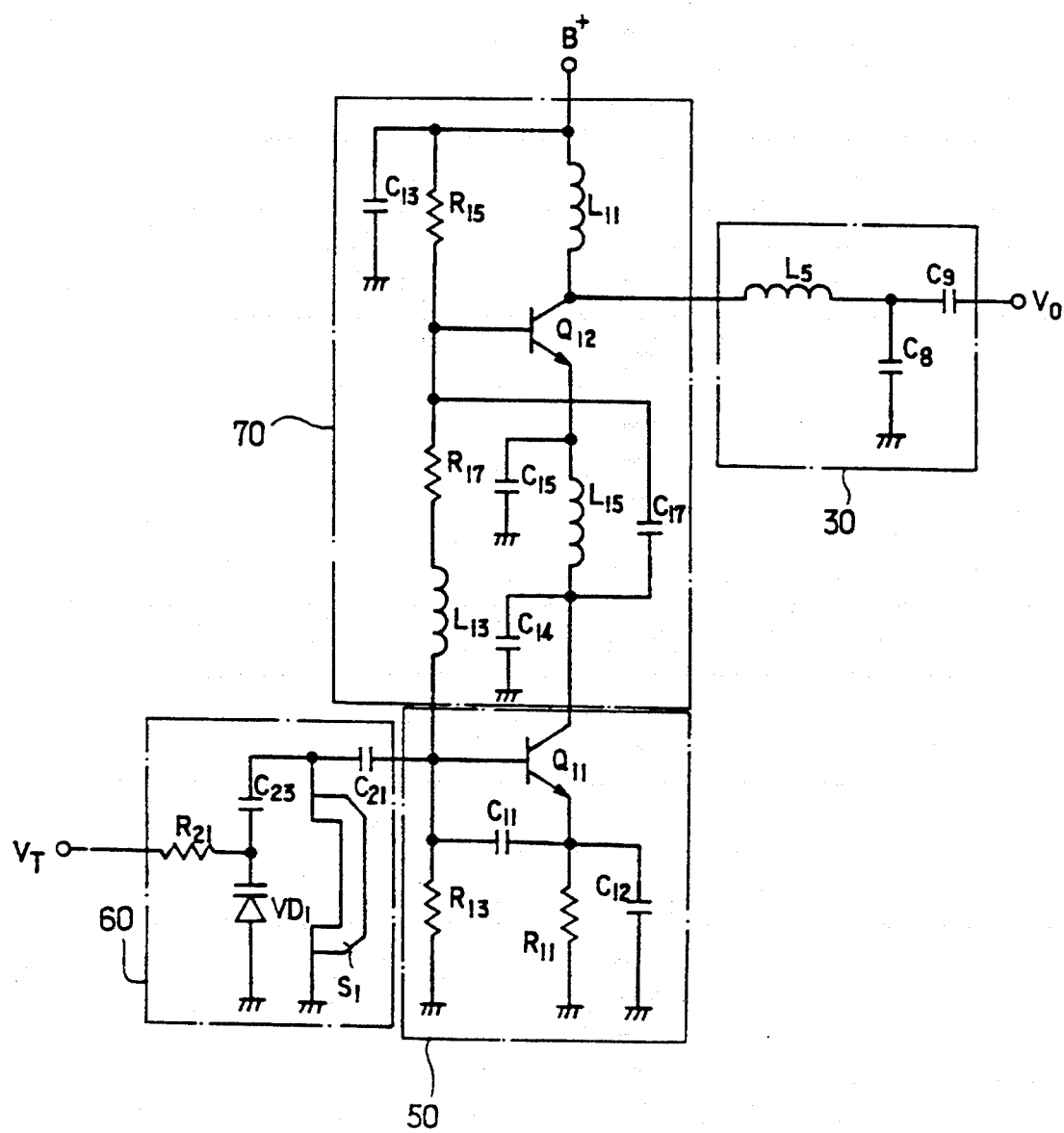
FIG. 2 illustrates a VCO circuit according to the present invention.

FIG. 2 illustrates a VCO circuit according to the present invention. As shown in this drawing, the circuit according to the present invention includes an oscillation amplifying circuit 50 which generates oscillations in accordance with resonance signals of a $\mu$-strip resonance circuit 60, thereby forming a common collector oscillating circuit.

A buffer amplifying circuit 70 is constituted as a single stage amplifying circuit, and is cascode coupled with the oscillation amplifying circuit 50.

The $\mu$-strip resonance circuit 60 includes a $\mu$-strip line S1, a varactor diode VD1 and a capacitor C23. A first terminal of the $\mu$-strip line S1 is grounded, while a second terminal of the $\mu$-strip line ST S1 is grounded after passing through the cathode-anode of the varactor diode VD1 and capacitor C23 in series.

A tuning voltage $V_T$ is supplied through a resistor R21 to the cathode of the varactor diode VD1. Therefore, the capacitance of the varactor diode VD1 is varied in accordance with the magnitude of the supplied tuning voltage $V_T$, and therefore, the resonance frequency of the microstrip resonance circuit 60 is determined by the capacitance of the varactor diode VD1, the serial total capacitance of capacitor C23, and the inductance of the $\mu$-strip line S1.

Such resonance frequency signals are supplied through a coupling capacitor C21 to the base of an oscillation amplifying transistor Q11 of the oscillation amplifying circuit 50. A feedback capacitor C11 is connected between the emitter and the base of the oscillation amplifying transistor Q11, while a feedback adjusting capacitor C12 is connected between its emitter and ground.

A resistor R13 is connected between the base of oscillation amplifying transistor Q11 and ground and the bias voltage from the buffer amplifying circuit 70 is supplied through resistor R13. Further, the collector of oscillation amplifying transistor Q11 is connected such that the driving current from the buffer amplifying circuit 70 is supplied through it. Further, a resistor R11 is connected to the emitter for bypassing the emitter of oscillation amplifying transistor Q11 current.

Thus, the oscillation amplifying circuit 50 oscillates in accordance with a resonance frequency which is determined by the μ-strip resonance circuit 60, while its output appears on the collector of the oscillation amplifying transistor Q11. Such oscillated signals are supplied through capacitor C17 to the base of a buffer amplifying transistor Q12 in the buffer amplifying circuit for signal coupling. Capacitor C14, which is connected between the collector of the oscillation amplifying transistor Q11 and ground, is for matching.

The oscillated signals which are supplied to the buffer amplifying transistor Q12 are amplified by this transistor Q12, and then, the amplified signals are outputted as the final output through an impedance matching circuit 30 which consists of capacitors C8 and C9 and a coil L5 for matching with the load.

Under this condition, a B+ circuit voltage is supplied as a dc driving current through an ac component bypassing capacitor C13 and an ac component blocking RF choke coil L11 to the collector of the buffer amplifying transistor Q12. The dc driving current which has passed through the buffer amplifying transistor Q12 is supplied through a signal inducing coil L15 to the collector of the oscillation amplifying transistor Q11. Further, the B+ circuit voltage is supplied as a dc bias voltage through resistor R15 and capacitor C13 (for bypassing the ac components) to the base of the buffer amplifying transistor Q12. The base bias of the buffer amplifying transistor Q12 is supplied through series resistor R17 and an ac component blocking RF choke coil L13 to the base of the oscillation amplifying transistor Q11 as a dc bias.

Therefore, the oscillation amplifying transistor Q11 and the buffer amplifying transistor Q12 form a cascode amplifying transistor with the RF choke coil L13 and the signal inducing coil L15. Accordingly these two transistors Q11 and Q12 are connected to each other in the case of dc signals, and isolated from each other in the case of ac signals. Consequently, the load pulling phenomenon such that the buffer amplifying circuit 70 is affected by the variations of the impedance of the load can be prevented, thereby preventing an influence to the resonance circuit 60.

That is, according to the present invention, the oscillation amplifying transistor Q11 which has the form of a common collector oscillating circuit is cascode-coupled with the common emitter buffer amplifying transistor Q12. Therefore, the impedance which is observed from the collector toward the base of the oscillation amplifying transistor Q11, and the impedance which is observed from the collector toward the emitter of the oscillation amplifying transistor Q11, are very high. Consequently, it is assured that the buffer amplifying circuit 70 is sufficiently isolated from the μ-strip resonance circuit 60.

According to the voltage controlled oscillating circuit of the present invention as described above, the variations of the oscillated frequency due to the load pulling phenomenon are prevented. Such prevention and the isolation characteristics are satisfied by the single step buffer amplifying circuit 70 which is cascode-coupled with the oscillation amplifying circuit 50. Therefore, a low consumption of the driving power and the saving of the manufacturing cost of the VCO are assured, as well as decreasing the bulk of the VCO.

What is claimed is:

1. A voltage controlled oscillating circuit for preventing a load pulling comprising:

a microstrip resonance circuit with its resonance frequency determined by an external tuning voltage;

an oscillation amplifying circuit connected to said microstrip resonance circuit and including an oscillation amplifying transistor having the form of a common collector, with said oscillation amplifying circuit performing oscillations in accordance with resonance frequency signals generated by said microstrip resonance circuit;

a buffer amplifying circuit including a buffer amplifying transistor and connected to the oscillation amplifying transistor of said oscillation amplifying circuit in the form of a cascode;

an oscillating signal inducing coil connected between a collector of said oscillation amplifying transistor and an emitter of said buffer amplifying transistor;

a coupling capacitor connected between the collector of said oscillation amplifying transistor and a base of said buffer amplifying transistor and supplying an oscillation signal appearing on the collector of the oscillation amplifying transistor through said oscillating signal inducing coil to the base of said buffer amplifying transistor.

* * * * *

UNITED STATES PATENT AND TRADEMARK OFFICE
CERTIFICATE OF CORRECTION

PATENT NO. : 5,440,276
DATED : August 8, 1995
INVENTOR(S) : Jung H. Kim

It is certified that error appears in the above-indentified patent and that said Letters Patent is hereby corrected as shown below:

Column 1 Line 29 ".varied" should read --varied--.

Column 1 Line 43 after "emitter" insert --to--.

Column 2 Line 38 "ST S1" should read --S1--.

Column 2 Lines 65-66 "the emitter for bypassing the emitter of oscillation amplifying transistor Q11 current." should read --the emitter of oscillation amplifying transistor Q11 for bypassing the emitter current.--.

Column 3 Line 5 after "circuit" insert --70--.

Signed and Sealed this

Twenty-fourth Day of October, 1995

Attest:

BRUCE LEHMAN

Attesting Officer        Commissioner of Patents and Trademarks